(12) United States Patent
Kakitani et al.

(10) Patent No.: US 7,224,220 B2
(45) Date of Patent: May 29, 2007

(54) LOW DISTORTION VARIABLE GAIN AND ROOTING AMPLIFIER WITH SOLID STATE RELAY

(75) Inventors: Hisao Kakitani, Tokyo (JP); Kenichi Takano, Tokyo (JP)

(73) Assignee: Agilent Technologies, Inc., Palo Alto, CA (US)

( * ) Notice: Subject to any disclaimer, the term of this patent is extended or adjusted under 35 U.S.C. 154(b) by 145 days.

(21) Appl. No.: 10/918,904

(22) Filed: Aug. 16, 2004

(65) Prior Publication Data

US 2005/0052230 A1    Mar. 10, 2005

(30) Foreign Application Priority Data

Sep. 5, 2003    (JP) .............................. 2003-314198

(51) Int. Cl.
*H03F 1/14*    (2006.01)
*H03F 1/02*    (2006.01)

(52) U.S. Cl. .............................. 330/51; 330/9; 327/124
(58) Field of Classification Search ..................... None
See application file for complete search history.

(56) References Cited

U.S. PATENT DOCUMENTS 6,400,220 B1 *    6/2002    Wang et al. .................. 330/9
6,452,424 B1 *    9/2002    Shamlou et al. ............... 327/91
6,621,334 B2 *    9/2003    Ausserlechner et al. ........ 330/9
6,853,241 B2 *    2/2005    Fujimoto ........................ 330/9
6,897,720 B2 *    5/2005    Fujimoto ........................ 330/9
2003/0107432 A1 *    6/2003    Huynh ........................... 330/9

FOREIGN PATENT DOCUMENTS

| DE | 38 38 103 | 5/1990 |
| DE | 696 17 369 | 5/2002 |
| EP | 0 540 906 | 8/1997 |
| JP | 2000-298337 | 10/1926 |

OTHER PUBLICATIONS

Search Report for German Patent Application No. 10 2004 050 623.5.

* cited by examiner

*Primary Examiner*—Robert Pascal
*Assistant Examiner*—Krista M. Flanagan

(57) ABSTRACT

An amplifier which comprises an operational amplifier, a semiconductor switch that selectively connects at least one circuit to an input terminal of the operational amplifier, and a device for virtual shorting of both terminals of the semiconductor switch in an isolated state.

10 Claims, 9 Drawing Sheets

LOW DISTORTION VARIABLE GAIN AND ROOTING AMPLIFIER WITH SOLID STATE RELAY

FIELD OF THE INVENTION

The present invention pertains to an amplifier that uses switches and in particular, to a low distortion variable gain and rooting amplifier with semiconductor switches.

DISCUSSION OF THE BACKGROUND ART

Variable gain amplifiers and rooting amplifiers are amplifiers that use switches. The switches used by these amplifiers are mechanical switches such as reed relays and semiconductor switches (e.g., solid state relays, photoMOS relays, and CMOS analog switches). When compared to semiconductor switches, mechanical relays are large and have a short service life. On the other hand, semiconductor switches are small and have a long service life. However, semiconductor switches pose the following problems when used in variable gain amplifiers or rooting devices. First, the "on" resistance of a semiconductor switch is a source of gain error. Moreover, the nonlinearity of the "on" resistance of a semiconductor switch is a source of harmonic distortion. Furthermore, the capacitance between terminals of a semiconductor switch is a source of "off" isolation reduction at high frequency. In addition, the nonlinearity of the capacitance between terminals of a semiconductor switch is a source of harmonic distortion. It should be noted that the capacitance between the terminals of a semiconductor switch is the capacitance between the terminals of transmission path terminals.

Amplifiers that solve several of these problems have been proposed in recent years (for instance, refer to JP (Kokai) 2001-298,337).

However, the problems attributed to the capacitance between terminals of semiconductor switches have, of course, gone unsolved.

Therefore, the present invention solves the problems of amplifiers with semiconductor switches attributed to the capacitance between terminals of the semiconductor switch. Moreover, the present invention simplifies the adjustment of input impedance of amplifiers with semiconductor switches while solving the problems attributed to the capacitance between electrodes.

SUMMARY OF THE INVENTION

An amplifier which comprises an operational amplifier, a semiconductor switch that selectively connects at least one circuit to the input terminal of this operational amplifier, and a device for virtual shorting of both terminals of this semiconductor switch in an isolated state.

The present invention also pertains to an inverting amplifier which comprises an operational amplifier, a semiconductor switch, one end of which is connected to the inverting input terminal of this operational amplifier, and a device for bringing the other end of this semiconductor switch in an isolated state to the same potential as the non-inverting input terminal of this operational amplifier.

DETAILED DESCRIPTION OF THE PREFERRED EMBODIMENT

The problems with amplifiers with semiconductor switches that are attributed to the capacitance between terminals of the semiconductor switch are solved by the present invention. Moreover, the adjustment of the input impedance of amplifiers with semiconductor switches is simplified by the present invention.

Figure 1A:
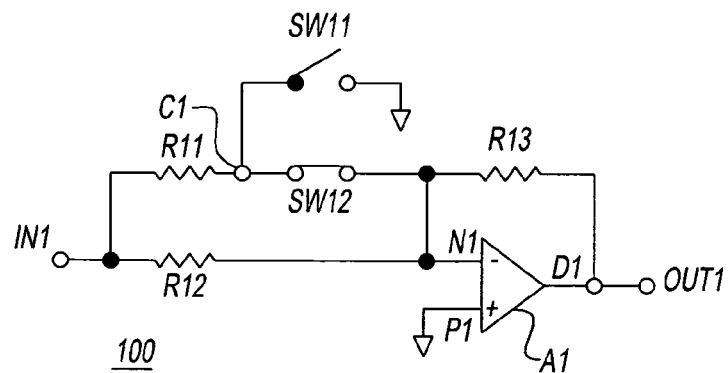
FIG. 1A is a block diagram of variable gain amplifier 100 of the present invention.
Figure 1B:
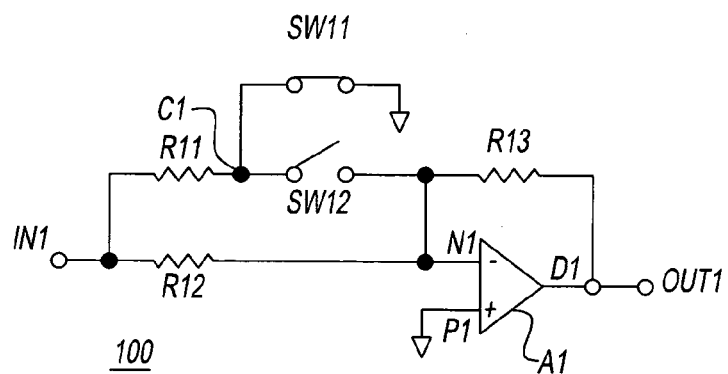
FIG. 1B is a block diagram of variable gain amplifier 100 of the present invention.

The present invention is described in detail below while referring to the embodiments shown in the attached drawings. The first embodiment of the present invention is a variable gain amplifier, a block diagram of which is shown in FIGS. 1A and 1B. In FIGS. 1A and 1B, a variable gain amplifier 100 is an inverting amplifier that uses an operational amplifier A1. A resistor R12 is connected between an input terminal IN1 of variable gain amplifier 100 and an inverting input terminal N1 of operational amplifier A1. A series circuit comprised of a resistor R11 and a semiconductor switch SW12 is connected in parallel to the resistor R12 between input terminal IN1 and inverting input terminal N1. A resistor R13 is connected between inverting input terminal N1 and an output terminal D1 of operational amplifier A1. Output terminal D1 is connected to an output terminal OUT1 of variable gain amplifier 100. A non-inverting input terminal P1 of operational amplifier A1 is grounded. A connection C1 between resistor R11 and semiconductor switch SW12 is selectively grounded by a semiconductor switch SW11. When either semiconductor switch SW11 or SW12 is in an isolated state, the other switch is always in a conducting state or both ends of the semiconductor switch in an isolated state are virtually shorted. Virtual shorting is different from direct shorting and is shorting using the fact that the inverting input terminal and the non-inverting input terminal of the operational amplifier are kept at the same potential.

Figure 9:
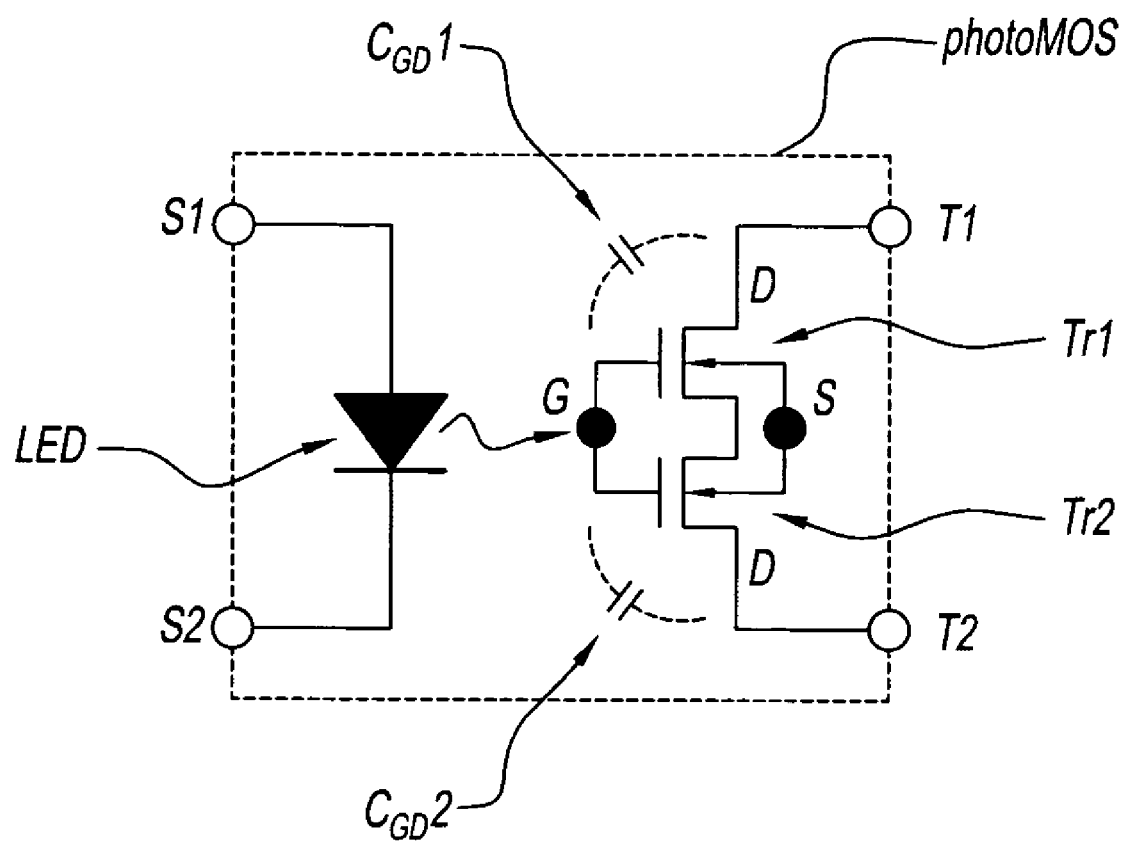
FIG. 9 is a block diagram of signal rooting amplifier 900 of the present invention.

Semiconductor switches SW11 and SW12 are PhotoMOS relays. A PhotoMOS relay is a type of photocoupler that uses a MOS-FET for the switch part. A typical internal block diagram of a PhotoMOS relay is shown in FIG. 9. In FIG. 9, the PhotoMOS comprises an LED connected between terminals S1 and S2 and an NMOS element Tr1 and an NMOS element Tr2 connected between terminals T1 and T2, and it operates as a switch. The source and bulk terminal of Tr1 and the source and bulk terminal of Tr2 are connected to one another. The gates of Tr1 and Tr2 are driven by the light from an LED. When the LED emits light, floating voltage is generated between the gates and the sources of Tr1 and Tr2 and electricity is conducted between terminals T1 and T2. In the end, the PhotoMOS is in a conducting state ("on" state). The voltage between the gate and the source of Tr1 and Tr2 is constant and therefore, the ON resistance of Tr1 and Tr2 is constant. Moreover, drain voltage and source voltage are the same in an "on" state at this time and therefore, the gate voltage imitates the drain voltage. That is, gate-drain voltage is held at a constant voltage and therefore, current does not flow between gate-drain capacitance $C_{GD}1$ and $C_{GD}2$. Consequently, the PhotoMOS in a conducting state does not generate harmonic distortion attributed to capacitance $C_{GD}1$ and capacitance $C_{GD}2$, and displays very low distortion properties. On the other hand, when the LED does not emit light, terminal T1 and terminal T2 are isolated from one another. In the end, the PhotoMOS is in an isolated state ("off" state). The gate-drain voltage of Tr1 and Tr2 at this time is not constant and the gate voltage does not imitate the drain voltage. Therefore, current flows to capacitance $C_{GD}1$ and capacitance $C_{GD}2$. Thus, the PhotoMOS in an isolated state generates harmonic distortion attributed to $C_{GD}1$ and capacitance $C_{GD2}$. The present invention shorts both terminals of the PhotoMOS in an isolated state in order to prevent harmonic distortion attributed to capacitance $C_{GD}1$ and capacitance $C_{GD}2$. Unless otherwise noted, the semiconductor switches cited hereafter are all PhotoMOS relays.

In FIG. 1A, semiconductor switch SW11 is in an isolated state and semiconductor switch SW12 is in a conducting state. In this case, the amplification factor $\beta_1$ of variable gain amplifier 100 is $\beta_1=R13\cdot(R11+R12)/(R11\cdot R12)$. Moreover, the input resistance $R_i1$ of variable gain amplifier 100 is $R_i1=(R11\cdot R12)/(R11+R12)$. Inverting input terminal N1 and non-inverting input terminal P1 are at the same potential as a result of the effect of operational amplifier A1. Consequently, both terminals of semiconductor switch SW11 in an isolated state are virtually shorted by semiconductor switch SW12.

In FIG. 1B, semiconductor switch SW11 is in a conducting state and semiconductor switch SW12 is in an isolated state. The amplification factor $\beta_1$ of variable gain amplifier 100 in this case is $\beta_1=R13/R12$. Moreover, input resistance $R_i1$ of variable gain amplifier 100 is $R_i1=(R11\cdot R12)/(R11+R12)$. Inverting input terminal N1 and non-inverting input terminal P1 are at the same potential as a result of the effect of operational amplifier A1. Therefore, both ends of semiconductor switch SW12 in an isolated state are virtually shorted by semiconductor switch SW11.

Variable gain amplifier 100 is characterized in that the input resistance and the feedback resistance are constant.

Figure 2:
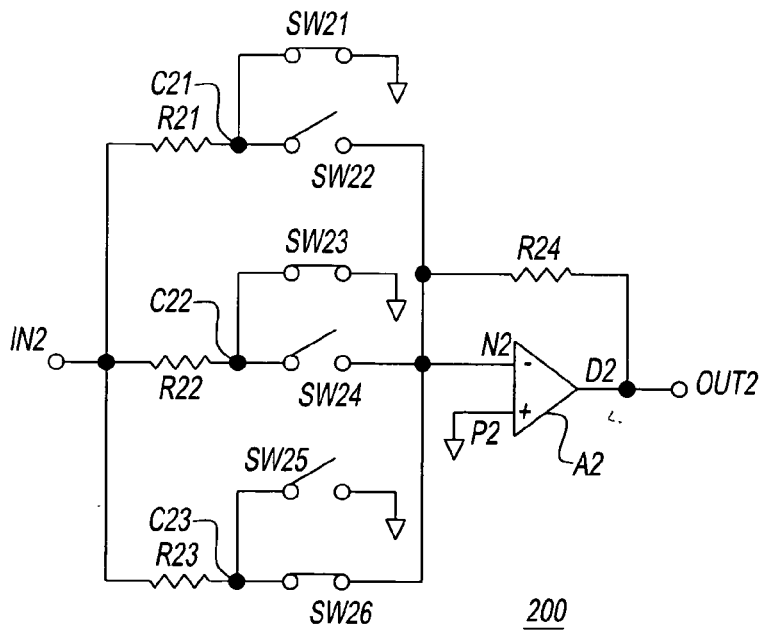
FIG. 2 is a block diagram of variable gain amplifier 200 of the present invention.

Several modifications to variable gain amplifier 100 are possible as long as it has the function of virtual shorting of the semiconductor switches in an isolated state. A different version of variable gain amplifier 100 is shown in FIG. 2 as a second embodiment of the present invention. In FIG. 2, a variable gain amplifier 200 is an inverting amplifier that uses an operational amplifier A2. A series circuit comprised of a resistor R21 and a semiconductor switch SW22, a series circuit comprised of a resistor R22 and a semiconductor switch SW24, and a series circuit comprised of a resistor R23 and a semiconductor switch SW26 are connected in parallel between an input terminal IN2 of variable gain amplifier 200 and an inverting input terminal N2 of operational amplifier A2. A resistor R24 is connected between inverting input terminal N2 and an output terminal D2 of operational amplifier A2. Output terminal D2 is connected to an output terminal OUT2 of variable gain amplifier 200. A non-inverting input terminal P2 of operational amplifier A2 is grounded. A connection C21 between resistor R21 and a semiconductor switch SW22 is selectively grounded by a semiconductor switch SW21. A connection C22 between resistor R22 and semiconductor switch SW24 is selectively grounded by a semiconductor switch SW23. A connection C23 between resistor R23 or semiconductor switch SW26 is selectively grounded by a semiconductor switch SW25. Variable gain amplifier 200 has the function of virtual shorting of semiconductor switches in an isolated state. Consequently, when either semiconductor switch SW21 or semiconductor switch SW22 is in an isolated state, the other one is always in a conducting state and both terminals of the semiconductor switch in an isolated state are virtually shorted. When either semiconductor switch SW23 or semiconductor switch SW24 is in an isolated state, the other one is always in a conducting state and both terminals of the semiconductor switch in an isolated state are virtually shorted. When either semiconductor switch SW25 or semiconductor switch SW26 is in an isolated state, the other one is always in a conducting state and both terminals of the semiconductor switch in an isolated state are virtually shorted.

In FIG. 2, inverting input terminal N2 and non-inverting input terminal P2 are at the same potential as a result of the effect of operational amplifier A2. Consequently, both terminals of semiconductor switch SW22 in an isolated state are virtually shorted by semiconductor switch SW21. Moreover, both terminals of semiconductor switch SW24 in an isolated state are virtually shorted by semiconductor switch SW23. Furthermore, both terminals of semiconductor switch SW25 in an isolated state are virtually shorted by semiconductor switch SW26.

Variable gain amplifier 200 is characterized in that the input resistance and the feedback resistance are constant.

Figure 3A:
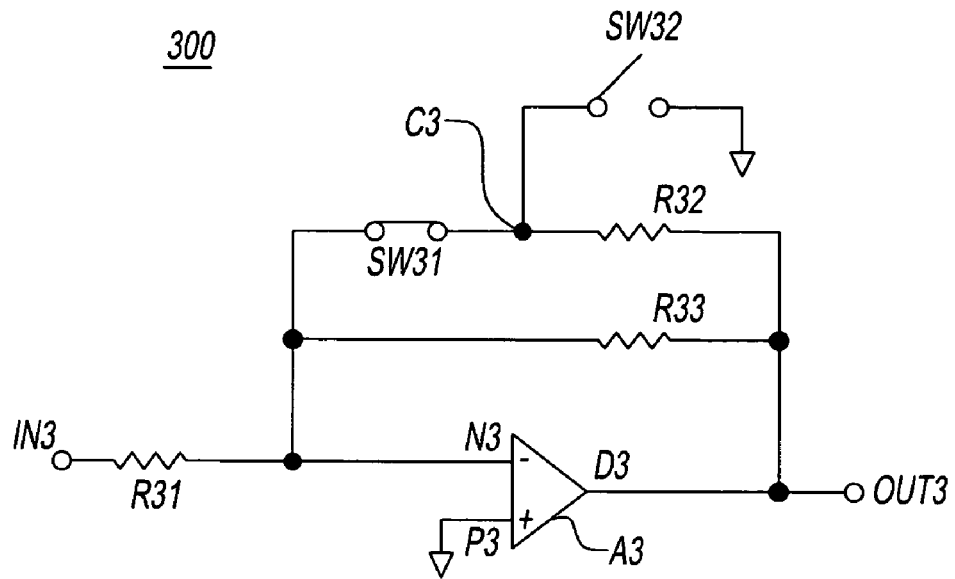
FIG. 3A is a block diagram of variable gain amplifier 300 of the present invention.
Figure 3B:
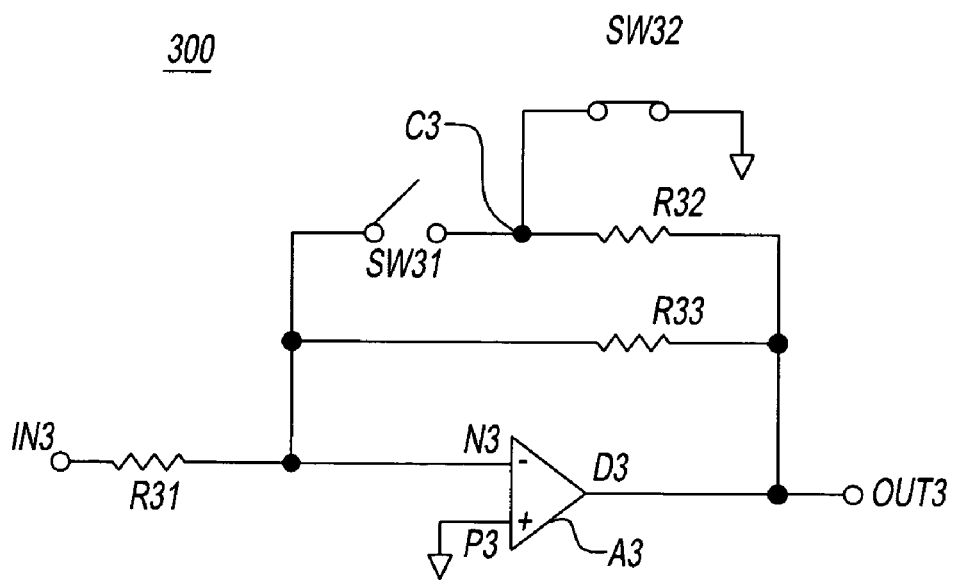
FIG. 3B is a block diagram of variable gain amplifier 300 of the present invention.

The gain of variable gain amplifier 100 in FIGS. 1A and 1B is varied based on which input element or input circuit is selected. Next, a variable gain amplifier whose gain is varied based on which feedback element or feedback circuit is selected is shown in FIGS. 3A and 3B as a third embodiment of the present invention. FIGS. 3A and 3B show a variable gain amplifier 300. Variable gain amplifier 300 is an inverting amplifier that uses an operational amplifier A3. A resistor R31 is connected between an input terminal IN3 of variable gain amplifier 300 and an inverting input terminal N3 of operational amplifier A3. A resistor R33 is connected between inverting input terminal N3 and an output terminal D3 of operational amplifier A3. A series circuit comprised of a semiconductor switch SW31 and resistor R32 is connected in parallel to a resistor R33 between inverting input terminal N3 and output terminal D3 of operational amplifier A3. Output terminal D3 is connected to an output terminal OUT3 of variable gain amplifier 300. A non-inverting input terminal P3 of operational amplifier A3 is grounded. A connection C3 between semiconductor switch SW31 and resistor R32 is selectively grounded by a semiconductor switch SW32. When either semiconductor switch SW31 or semiconductor switch SW32 is in an isolated state, the other one is always in a conducting state and both terminals of the semiconductor switch in an isolated state are virtually shorted.

In FIG. 3A, semiconductor switch SW31 is in a conducting state and semiconductor switch SW32 is in an isolated state. The amplification factor $\beta_3$ of variable gain amplifier 100 is $\beta_3=(R32 \cdot R33)/(R32+R33)/R31$ in this case. Moreover, the input resistance $R_i3$ of variable gain amplifier 100 is $R_i3=R31$. Inverting input terminal N3 and non-inverting input terminal P3 are at the same potential as a result of the effect of operational amplifier A3. Consequently, both terminals of semiconductor switch SW32 in an isolated state are virtually shorted by semiconductor switch SW31.

In FIG. 3B, semiconductor switch SW31 is in an isolated state and semiconductor switch SW32 is in a conducting state. In this case, the amplification factor $\beta_3$ of variable gain amplifier 100 is $\beta_3=R33/R31$. Moreover, the input resistance $R_i3$ of variable gain amplifier 100 is $R_i3=R31$. Inverting input terminal N3 and non-inverting input terminal P3 are at the same potential as a result of the effect of operational amplifier A3. Consequently, both terminals of semiconductor switch SW31 in an isolated state are virtually shorted by semiconductor switch SW32.

Variable gain amplifier 300 is characterized in that the input resistance is constant.

Figure 4:
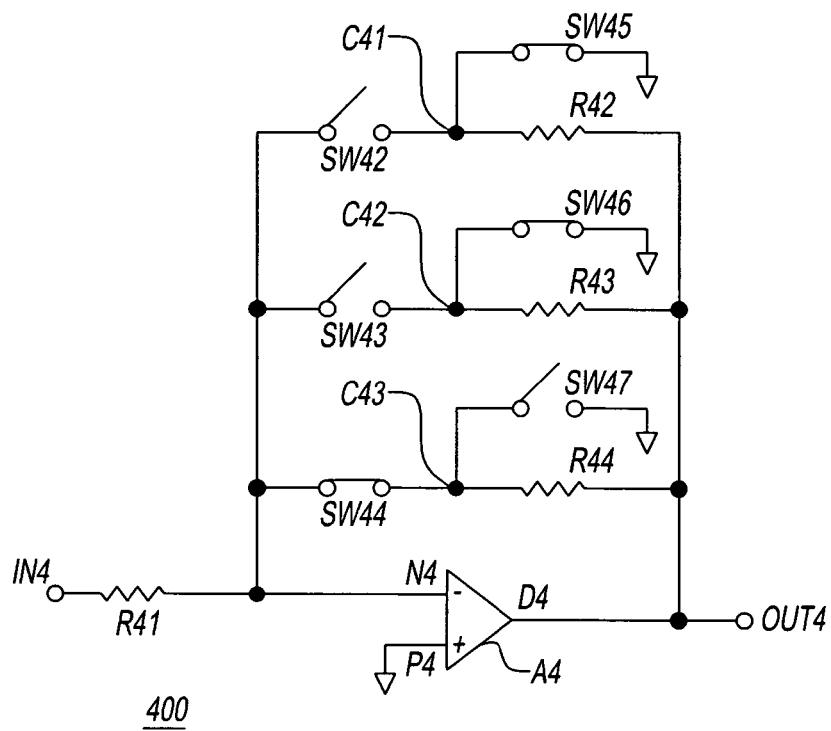
FIG. 4 is a block diagram of variable gain amplifier 400 of the present invention.

Variable gain amplifier 300 can be modified as long as it has the function of virtual shorting of the semiconductor switch in an isolated state. Another version of variable gain amplifier 300 is shown in FIG. 4 as the fourth embodiment. A variable gain amplifier 400 in FIG. 4 is an inverting amplifier that uses an operational amplifier A4. A resistor R41 is connected between an input terminal IN4 of variable gain amplifier 400 and an inverting input terminal N4 of operational amplifier A4. A series circuit comprised of a semiconductor switch SW42 and a resistor R42, a series circuit comprised of a semiconductor switch SW43 and a resistor R43, and a series circuit of a semiconductor switch SW44 and a resistor R44 are connected in parallel between inverting input terminal N4 and an output terminal D4 of operational amplifier A4. Output terminal D4 is connected to an output terminal OUT4 of variable gain amplifier 400. A non-inverting input terminal P4 of operational amplifier A4 is grounded. A connection C41 between a semiconductor switch SW42 and resistor R42 is selectively grounded by a semiconductor switch SW45. A connection C42 between semiconductor switch SW43 and resistor R43 is selectively grounded by a semiconductor switch SW46. A connection C43 between semiconductor switch SW44 and resistor R44 is selectively grounded by a semiconductor switch SW47. The variable gain amplifier 400 has the function of virtual shorting of the semiconductor switch in an isolated state. Consequently, when either semiconductor switch SW42 or SW45 is in an isolated state, the other one is always in a conducting state and both terminals of the semiconductor switch in an isolated state are virtually shorted. When either semiconductor switch SW43 or SW46 is in an isolated state, the other one is always in a conducting state and both terminals of the semiconductor switch in an isolated state are virtually shorted. When either semiconductor switch SW44 or SW47 is in isolated state, the other one is always in a conducting state and both terminals of the semiconductor switch in an isolated state are virtually shorted.

Inverting input terminal N4 and non-inverting input terminal P4 in FIG. 4 are at the same potential as a result of the effect of operational amplifier A4. Consequently, both terminals of semiconductor switch SW42 in an isolated state are virtually shorted by semiconductor switch SW45. Moreover, both terminals of semiconductor switch SW43 in an isolated state are virtually shorted by semiconductor switch SW46. Furthermore, both terminals of semiconductor switch SW47 in an isolated state are virtually shorted by semiconductor switch SW44.

Variable gain amplifier 400 is characterized in that the input resistance is constant.

Figure 5:
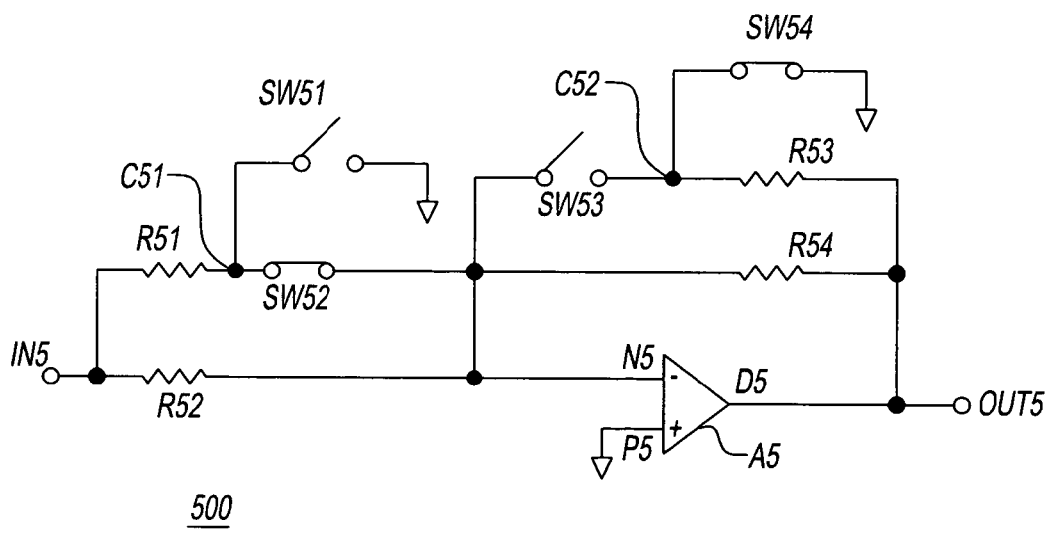
FIG. 5 is a block diagram of variable gain amplifier 500 of the present invention.

Next, a variable gain amplifier with which it is possible to select an input element or an input circuit and to select a feedback element or a feedback circuit is shown in FIG. 5 as another embodiment. A variable gain amplifier 500 in FIG. 5 is an inverting amplifier that uses an operational amplifier A5. A resistor R52 is connected between an input terminal IN5 of variable gain amplifier 500 and an inverting input terminal N5 of operational amplifier A5. A series circuit comprised of a resistor R51 and a semiconductor switch SW52 is connected in parallel to resistor R52 between input terminal IN5 and inverting input terminal N5. A resistor R54 is connected between inverting input terminal N5 and an output terminal D5 of operational amplifier A5. A series circuit comprised of a semiconductor switch SW53 and a resistor R53 is connected in parallel to resistor R54 between inverting input terminal N5 and output terminal D5 of operational amplifier A5. Output terminal D5 is connected to an output terminal OUT5 of variable gain amplifier 500. A non-inverting input terminal P5 of operational amplifier A5 is grounded. A connection C51 between resistor R51 and semiconductor switch SW52 is selectively grounded by a semiconductor switch SW51. A connection C52 between semiconductor switch SW53 and resistor R53 is selectively grounded by a semiconductor switch SW54. Variable gain amplifier 500 has the function of virtual shorting of the semiconductor switch in an isolated state. Consequently, when either semiconductor switch SW51 or SW52 is in an isolated state, the other one is always in a conducting state and both terminals of the semiconductor switch in an isolated state are virtually shorted. When either semiconductor switch SW53 or SW54 is in an isolated state, the other one is always in a conducting state and both terminals of the semiconductor switch in an isolated state are virtually shorted.

Inverting input terminal N5 and non-inverting input terminal P5 in FIG. 5 are at the same potential as a result of the effect of operational amplifier A5. Consequently, both terminals of semiconductor switch SW51 in an isolated state are virtually shorted by semiconductor switch SW52. Moreover, both terminals of semiconductor switch SW53 in an isolated state are virtually shorted by semiconductor switch SW54.

Variable gain amplifier 500 is characterized in that the input resistance is constant.

Figure 6A:
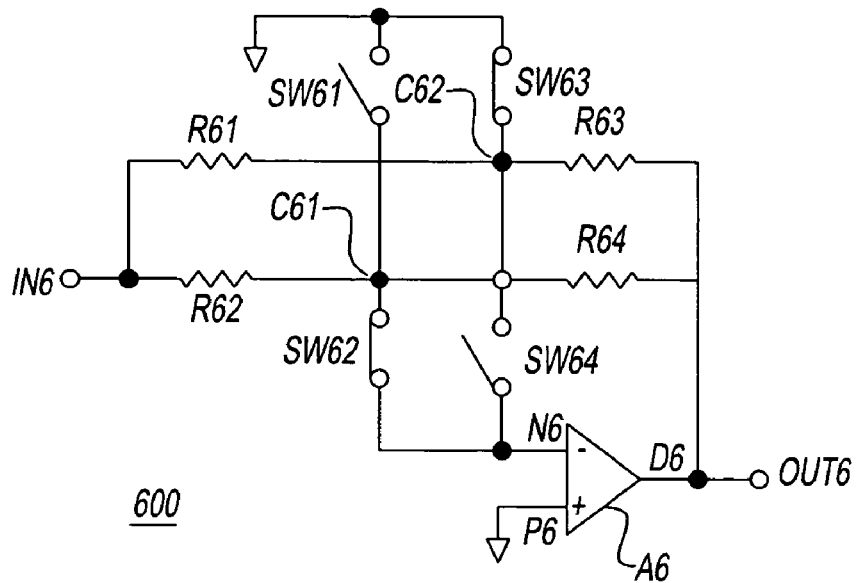
FIG. 6A is a block diagram of variable gain amplifier 600 of the present invention.
Figure 6B:
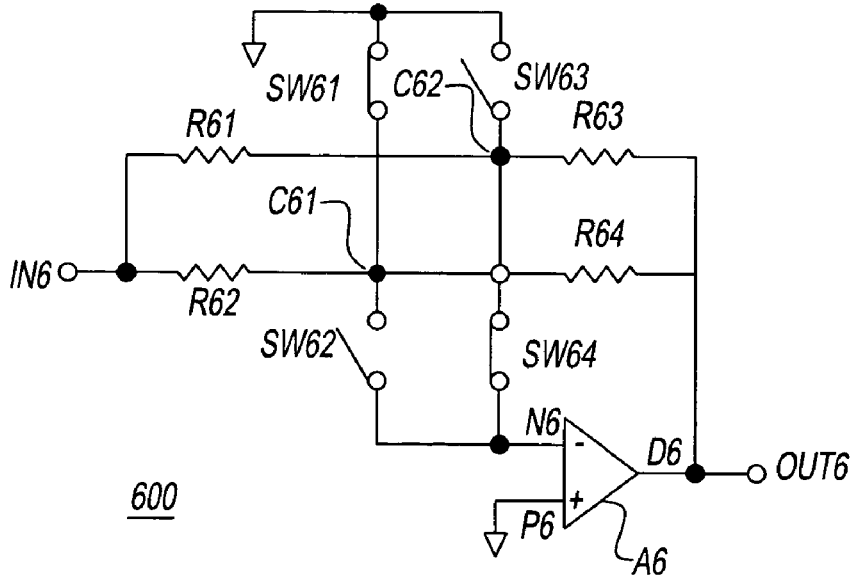
FIG. 6B is a block diagram of variable gain amplifier 600 of the present invention.

Next, a variable gain amplifier with which there is no gain error problem due to "on" resistance of the semiconductor switches is shown in FIGS. 6A and 6B as a sixth embodiment. A variable gain amplifier 600 in FIGS. 6A and 6B is an inverting amplifier that uses an operational amplifier A6. A series circuit comprised of a resistor R61 and a resistor R63 and a series circuit comprised of a resistor R62 and a resistor R64 are connected in parallel between an input terminal IN6 of variable gain amplifier 600 and an output terminal D6 of operational amplifier A6. A connection C61 between resistor R62 and resistor R64 is selectively connected to an inverting input terminal N6 of operational amplifier A6 via a semiconductor switch SW62. A connection C62 between resistor R61 and resistor R63 is selectively connected to inverting input terminal N6 of operational amplifier A6 via a semiconductor switch SW64. Output terminal D6 is connected to an output terminal OUT6 of variable gain amplifier 600. A non-inverting input terminal P6 of operational amplifier A6 is grounded. Connection C61 is selectively grounded by a semiconductor switch SW61. Connection C62 is selectively grounded by a semiconductor switch SW63. Variable gain amplifier 600 has the function of virtual shorting of the semiconductor switch in an isolated state. Consequently, when either semiconductor switch SW61 or SW62 is in an isolated state, the other one is always in a conducting state and both terminals of the semiconductor switch in an isolated state are virtually shorted. When either semiconductor switches SW63 or SW64 is in an isolated state, the other one is always in a conducting state and both terminals of the semiconductor switch in an isolated state are virtually shorted.

In FIG. 6A, semiconductor switch SW61 and semiconductor switch SW64 are in an isolated state, whereas semiconductor switch SW62 and semiconductor switch SW63 are in a conducting state. The amplification factor $\beta_6$ of variable gain amplifier 600 is $\beta_6 = R64/R62$. Moreover, the input resistance $R_i6$ of variable gain amplifier 600 is $R_i6 = (R61 \cdot R62)/(R61+R62)$. Inverting input terminal N6 and non-inverting input terminal P6 are at the same potential as a result of the effect of operational amplifier A6. Consequently, both terminals of semiconductor switch SW61 in an isolated state are virtually shorted by semiconductor switch SW62. Moreover, both terminals of solid state switch SW64 in an isolated state are virtually shorted by semiconductor switch SW63.

In FIG. 6B, semiconductor switch SW61 and semiconductor switch SW64 are in a conducting state and semiconductor switch SW62 and semiconductor switch SW63 are in an isolated state. In this case, the amplification factor $\beta_6$ of variable gain amplifier 600 is $\beta_6 = R63/R61$. Moreover, the input resistance $R_i6$ of variable gain amplifier 600 is $R_i6 = (R61 \cdot R62)/(R61+R62)$ in this case. Inverting input terminal N6 and non-inverting input terminal P6 are at the same potential as a result of the effect of operational amplifier A6. Consequently, both terminals of semiconductor switch SW62 in an isolated state are virtually shorted by semiconductor switch SW61. Moreover, both terminals of semiconductor switch 63 in an isolated state are virtually shorted by semiconductor switch SW64.

Variable gain amplifier 600 is also characterized in that the input resistance is constant.

Figure 7:
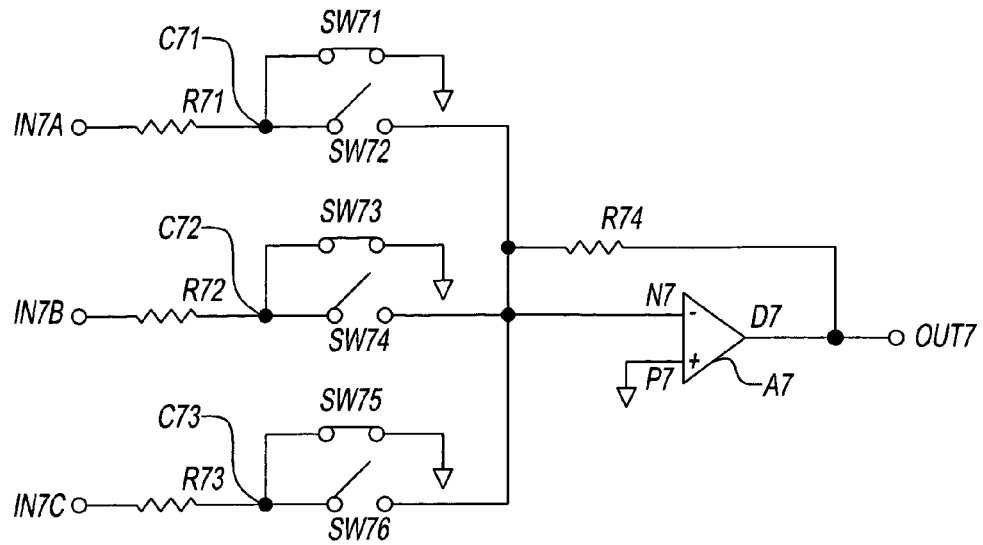
FIG. 7 is a block diagram of variable gain amplifier 700 of the present invention.

The present invention can be executed as a variable gain amplifier or a signal rooting amplifier. A signal rooting amplifier that is still another embodiment of the present invention will be described while referring to FIG. 7. FIG. 7 is a drawing showing signal rooting amplifier 700. In FIG. 7, signal rooting amplifier 700 comprises an input terminal IN7A, an input terminal IN7B, an input terminal IN7C, and an output terminal OUT7. Moreover, signal rooting amplifier 700 comprises an operational amplifier A7 with an inverting input terminal N7, a non-inverting input terminal P7, and an output terminal D7. A series circuit comprised of a resistor R71 and semiconductor switch SW72 is connected between input terminal IN7A and inverting input terminal N7. A series circuit comprised of a resistor R72 and a semiconductor switch SW74 is connected between input terminal IN7B and inverting input terminal N7. A series circuit comprised of a resistor R73 and a semiconductor switch SW76 is connected between input terminal IN7C and inverting input terminal N7. A resistor R74 is connected between inverting input terminal N7 and output terminal D7. Output terminal D7 is connected to output terminal OUT7 of variable gain amplifier 700. Non-inverting input terminal P7 is grounded. A connection C71 between resistor R71 and semiconductor switch SW72 is selectively grounded by a semiconductor switch SW71. A connection C72 between resistor R72 and semiconductor switch SW74 is selectively grounded by semiconductor switch SW73. A connection C73 between resistor R73 and semiconductor switch SW76 is selectively grounded by a semiconductor switch SW75. When either semiconductor switch SW71 or semiconductor switch SW72 is in an isolated state, the other one is always in a conducting state and both terminals of the semiconductor switch in an isolated state are virtually shorted. When either semiconductor switch SW73 or semiconductor switch SW74 is in an isolated state, the other one is always in a conducting state and both terminals of the semiconductor switch in an isolated state are virtually shorted. When either semiconductor switch SW75 or semiconductor switch SW76 is in an isolated state, the other one is always in a conducting state and both terminals of the semiconductor switch in an isolated state are virtually shorted.

In FIG. 7, inverting input terminal N7 and non-inverting input terminal P7 are at the same potential as a result of the effect of operational amplifier A7. Consequently, both terminals of semiconductor switch SW72 in an isolated state are virtually shorted by semiconductor switch SW71. Moreover, both terminals of semiconductor switch SW74 in an isolated state are virtually shorted by semiconductor switch SW73. Furthermore, both terminals of semiconductor switch SW75 in an isolated state are virtually shorted by semiconductor switch SW76. In FIG. 7, when any one of semiconductor switch SW72, semiconductor switch SW74, or semiconductor switch SW76 is selected, signal rooting amplifier 700 acts as a signal rooting amplifier of three inputs and one output. Moreover, when at least two of semiconductor switch SW72, semiconductor switch SW74, and semiconductor switch SW76 are selected, signal rooting amplifier 700 acts as a signal adding amplifier. It should be noted that the amplifier in FIG. 2 and the amplifier in FIG. 7 differ in whether or not input is common or separate.

Figure 8:
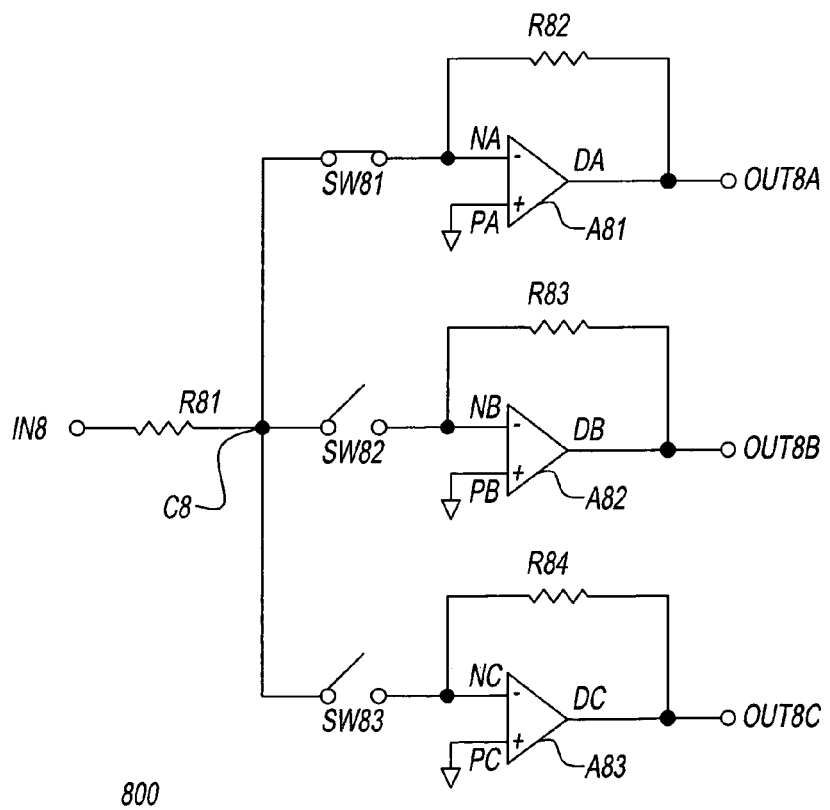
FIG. 8 is a block diagram of signal rooting amplifier 800 of the present invention.

The signal rooting amplifier shown in FIG. 7 is a multi-input amplifier. A multi-output signal rooting amplifier will now be described. A signal rooting amplifier that is another embodiment of the present invention is shown in FIG. 8. Signal rooting amplifier 800 in FIG. 8 comprises an input terminal IN8, an output terminal OUT8A, an output terminal OUT8B, and an output terminal OUT8C. Moreover, signal rooting amplifier 800 comprises an operational amplifier A81, an operational amplifier A82, and an operational amplifier A83. Operational amplifier A81 comprises an inverted input terminal NA, a non-inverted input terminal PA, and an output terminal DA. Operational amplifier A82 comprises an inverted input terminal NB, a non-inverted input terminal PB, and an output terminal DB. Operational amplifier A83 comprises an inverted input terminal NC, a non-inverted input terminal PC, and an output terminal DC. Furthermore, signal rooting amplifier 800 comprises a semiconductor switch SW81, a semiconductor switch SW82, and a semiconductor switch SW83, one end of each of which has a common connection. The common connection between semiconductor switch SW81, semiconductor switch SW82, and semiconductor switch SW83 is C8. A resistor R81 is connected between input terminal IN8 and connection C8. A resistor R82 is connected between inverting input terminal NA and output terminal DA. A resistor R83 is connected between inverted input terminal NB and output terminal DB. A resistor R84 is connected between inverted input terminal NC and output terminal DC. Non-inverted input terminal PA, non-inverted input terminal PB, and non-inverted input terminal PC are each grounded. Output terminal DA is connected to an output terminal OUT8A. Output terminal DB is connected to an output terminal OUT8B. Output terminal DC is connected to an output terminal OUT8C. When at least one of the semiconductor switches SW81, SW82, or SW83 is in an isolated state, at least one of the others is always in a conducting state and both terminals of the semiconductor switch in an isolated state are virtually shorted.

In FIG. 8, inverting input terminal NA and non-inverting input terminal PA are at the same potential as a result of the effect of operational amplifier A81. Moreover, inverting input terminal NB and non-inverting input terminal PB are at the same potential as a result of the effect of operational amplifier A82. Furthermore, inverting input terminal NC and non-inverting input terminal PC are at the same potential as a result of the effect of operational amplifier A83. Consequently, both terminals of semiconductor switch SW82 in an isolated state are virtually shorted by semiconductor switch SW81. Moreover, both terminals of semiconductor switch SW83 in an isolated state are virtually shorted by semiconductor switch SW81. When any one of semiconductor switch SW81, semiconductor switch SW82, or semiconductor switch SW83 in FIG. 8 is selected, signal rooting amplifier 800 acts as a signal rooting amplifier of one input and three outputs. When at least two of semiconductor switch SW81, semiconductor switch SW82, and semiconductor switch SW83 are selected, signal rooting amplifier 800 acts as a signal rooting amplifier.

Virtual shorting must be at least alternating-current shorting in each of the above-described embodiments. Moreover, it is preferred that the virtual shorting is alternating-current and direct-current shorting. Consequently, in each of the above-described embodiments, the potential of the grounded terminal of the semiconductor switch is a constant potential including ground potential when the potential of the non-inverting input terminal of the operational amplifier is nonzero. Thus, the effects of the present invention are produced without making any changes.

The results of the present invention are produced without making any changes, even when a resistor in the above-mentioned embodiments is replaced by another type of element or by a circuit having at least one element. For example, a resistor can be replaced with a capacitor or an inductor, or a resistor can be replaced by a parallel circuit of a capacitor and an inductor.

The results of the present invention will be numerically shown based on a working example. A working example of the present invention is variable gain amplifier 100 shown by the first embodiment wherein resistor R11 and resistor R12 are 1 kΩ and resister R13 is 500 Ω. A conventional example is variable gain amplifier 100 of the working example of the present invention minus semiconductor switch SW11. The amounts of harmonic distortion of the conventional example and the working example of the present invention are compared here.

Figure 10A:
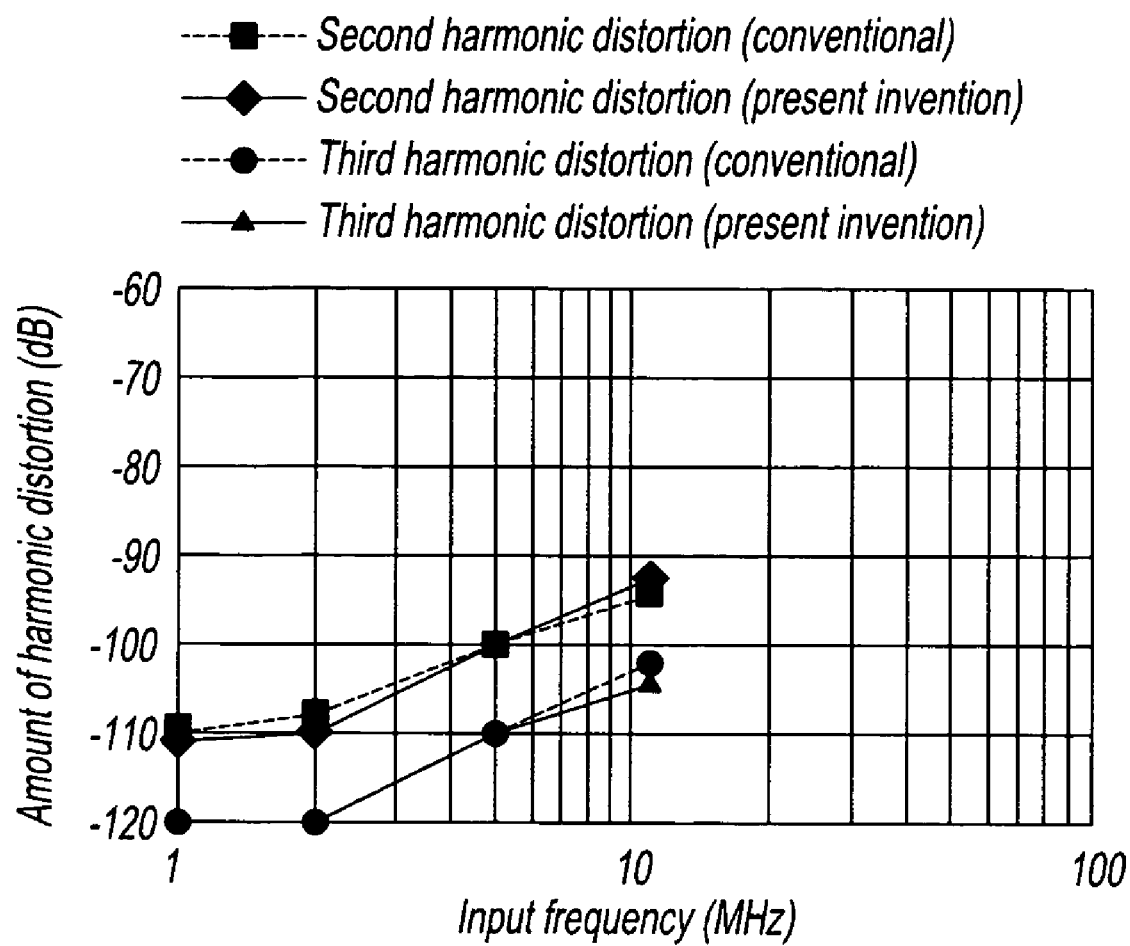
FIG. 10A is a drawing showing the results of measuring the amount of harmonic distortion.
Figure 10B:
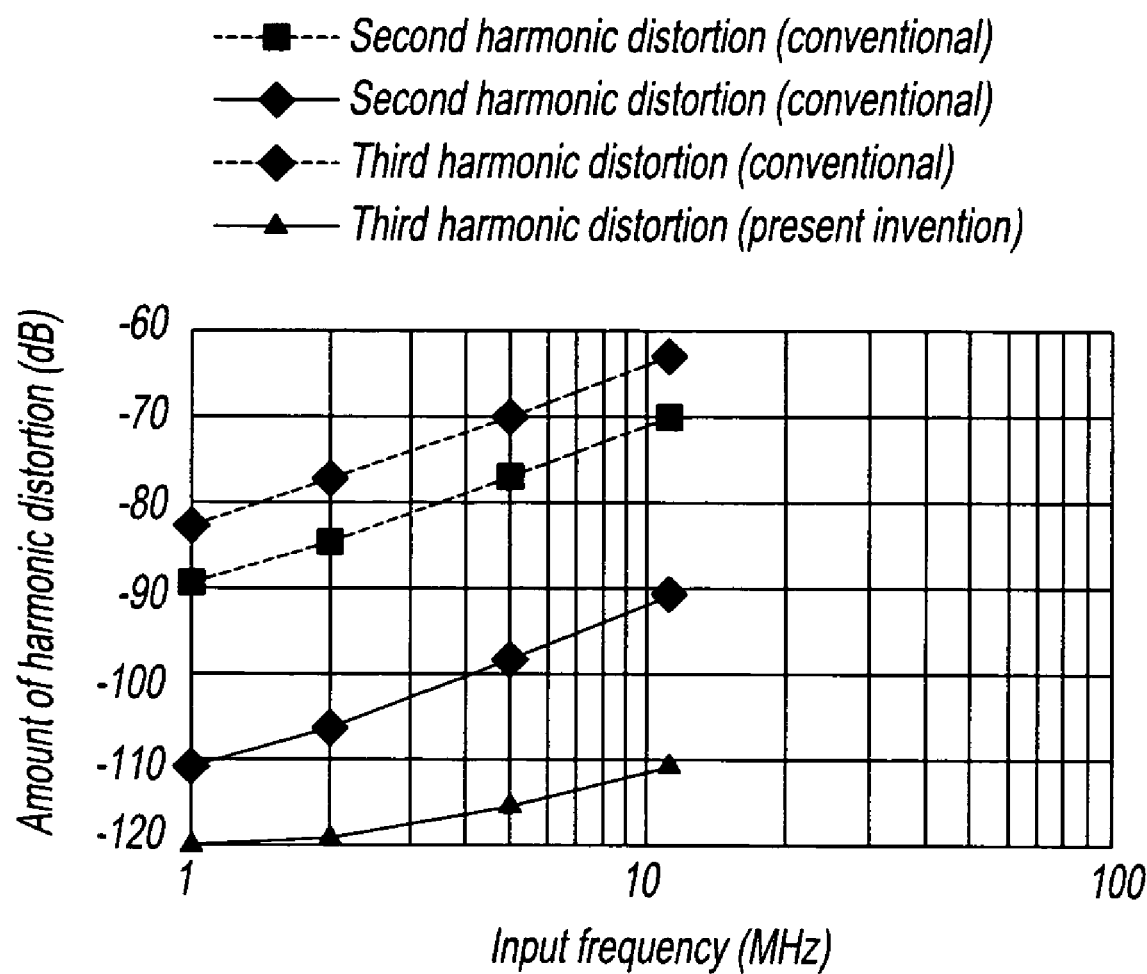
FIG. 10B is a drawing showing the results of measuring the amount of harmonic distortion.

FIG. 10A is a drawing showing the results of measuring the amount of harmonic distortion when semiconductor switch SW12 is in a conducting state. FIG. 10B is a drawing showing the results of measuring the amount of harmonic distortion when semiconductor switch SW12 is in an isolated state. In FIGS. 10A and 10B, the y-axis shows the amount of harmonic distortion and the x-axis shows frequency. Moreover, in FIG. 10A and FIG. 10B, the y-axis is a linear representation and the x-axis is a logarithmic representation. In FIG. 10A, the amount of harmonic distortion of the conventional example and the amount of harmonic distortion of the example of the present invention are the same. On the other hand, in FIG. 10B, the amount of harmonic distortion of the example of the present invention is as much as 30 dB improved over that of the conventional example.

Figure 11:
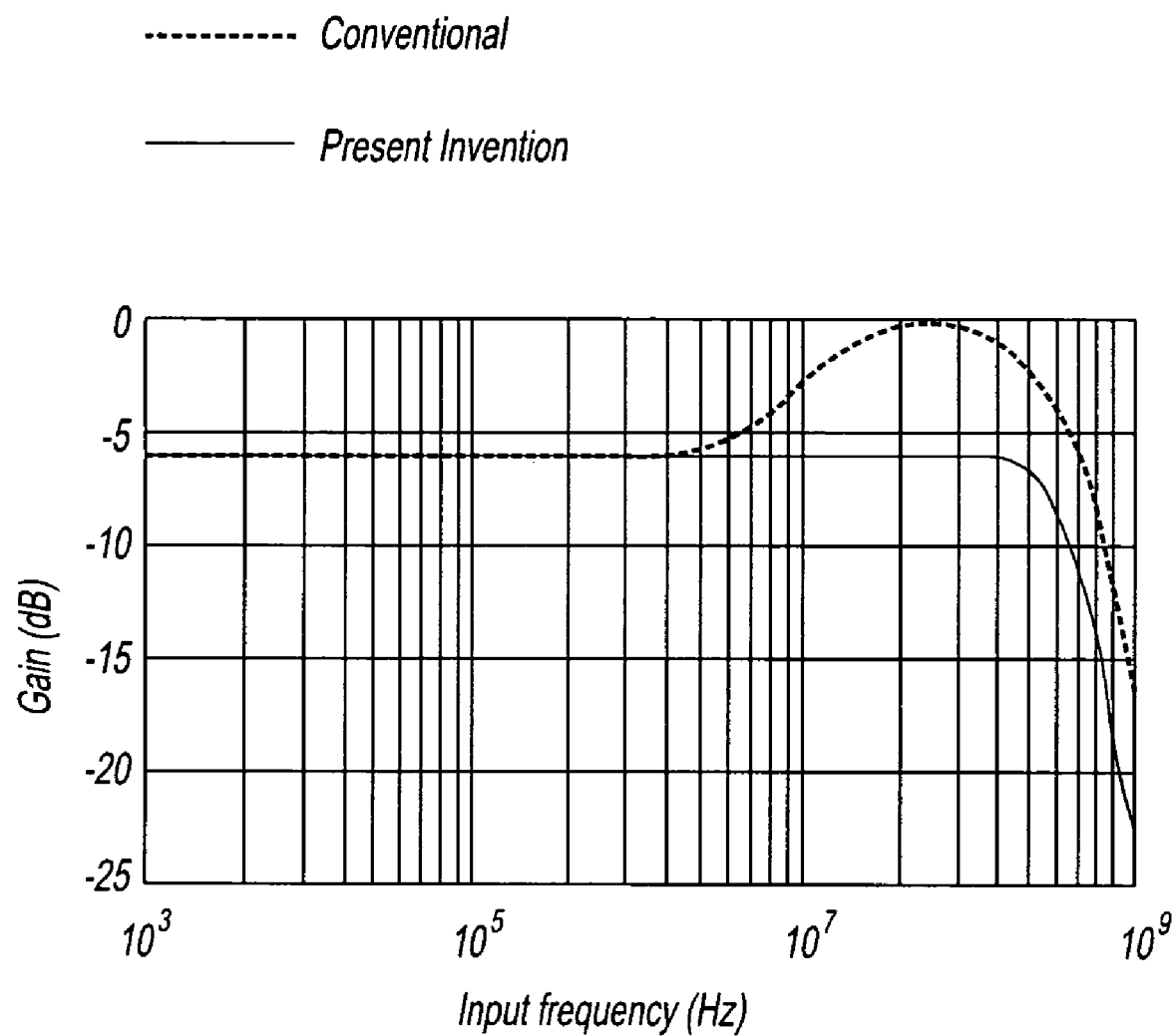
FIG. 11 is a drawing showing the frequency properties.

FIG. 11 is a drawing showing the frequency properties when semiconductor switch SW12 is in an isolated state. The y-axis in FIG. 11 shows gain and the x-axis shows frequency. Moreover, the y-axis in FIG. 11 is a linear representation and the x-axis is a logarithmic representation. Resistor R11 and resistor R12 are at 1 kΩ and resistor R13 is at 500 Ω. The capacitance between the terminals of semiconductor switch SW12 when in an isolated state is 12 picofarad. The frequency properties of the conventional example showed considerable feed-through in the high-frequency region. On the other hand, the frequency properties in the working example of the present invention were flat over all pass bands. Thus, it is clear that the working example of the present invention has better isolation properties than the conventional example.

What is claimed is:

1. An inverting amplifier which comprises:
   an operational amplifier,
   a semiconductor switch,
   one terminal of which is connected to the inverting input terminal of this operational amplifier by an input circuit having one or more input circuit terminals, and
   a device for bringing the other terminal of this semiconductor switch in an isolated state to the same potential as the non-inverting input terminal of this operational amplifier.

2. The inverting amplifier according to claim 1, wherein at least one of the one or more input circuit terminals has a common connection to form the input of said inverting amplifier.

3. The inverting amplifier according to claim 1, wherein at least one of the one or more input circuit terminals individually forms the input of said inverting amplifier.

4. An inverting amplifier which comprises:
   an operational amplifier,
   multiple input circuits,
   at least one semiconductor switch connected between these input circuits and the inverting input terminal of this operational amplifier, and
   a device for virtual shorting of both terminals of this semiconductor switch in an isolated state.

5. An inverting amplifier which comprises:
   an operational amplifier,
   multiple feedback circuits connected between the inverting input terminal of this operational amplifier and the output terminal of this operational amplifier,
   at least one semiconductor switch connected between these feedback circuits and the inverting input terminal of this operational amplifier, and
   a device for virtual shorting of both terminals of this semiconductor switch in an isolated state.

6. The inverting amplifier according to claim 5, wherein at least one of the terminals of each of said feedback circuits has a common connection to form the input of said inverting amplifier.

7. The inverting amplifier according to claim 5, wherein at least one of the terminals of each of said feedback circuits individually forms the input of said inverting amplifier.

8. An inverting amplifier which comprises:
an operational amplifier,
multiple input circuits,
at least one first semiconductor switch connected between these input circuits and the inverting input terminal of this operational amplifier,
multiple feedback circuits connected between the inverting input terminal of this operational amplifier and the output terminal of this operational amplifier,
at least one second semiconductor switch connected between these feedback circuits and the inverting input terminal of this operational amplifier, and
a device for virtual shorting of both terminals of this first semiconductor switch and this second semiconductor switch in an isolated state.

9. An inverting amplifier which comprises:
an operational amplifier,
multiple series circuits, whereby input circuits and feedback circuits are connected in series,
multiple semiconductor switches, which selectively connect the respective connections between these input circuits and these feedback circuits to the inverting input terminal of this operational amplifier, and
a device for virtual shorting of both terminals of these semiconductor switches in an isolated state.

10. An inverting amplifier which comprises:
multiple operational amplifiers,
multiple semiconductor switches, where one terminal of each has a common connection and the other terminal of each is connected to the respective inverting input terminal of these operational amplifiers, and
a device for virtual shorting of both terminals of these semiconductor switches in an isolated state.

* * * * *